United States Patent
Kim

(10) Patent No.: US 9,773,758 B2
(45) Date of Patent: Sep. 26, 2017

(54) SEMICONDUCTOR DEVICE WITH MAGNETICALLY ALIGNED CHIPS AND METHOD FOR FABRICATING THE SAME

(71) Applicant: SAMSUNG ELECTRONICS CO., LTD., Suwon-si, Gyeonggi-do (KR)

(72) Inventor: Ji Young Kim, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/264,736

(22) Filed: Sep. 14, 2016

(65) Prior Publication Data

US 2017/0162543 A1    Jun. 8, 2017

(30) Foreign Application Priority Data

Dec. 3, 2015    (KR) .................. 10-2015-0171793

(51) Int. Cl.
*H01L 25/065* (2006.01)
*H01L 43/02* (2006.01)

(52) U.S. Cl.
CPC .......... *H01L 25/0657* (2013.01); *H01L 43/02* (2013.01); *H01L 2225/06541* (2013.01)

(58) Field of Classification Search
CPC combination set(s) only.
See application file for complete search history.

(56) References Cited

U.S. PATENT DOCUMENTS

| | | | |
|---|---|---|---|
| 7,432,114 B2 | 10/2008 | Teshirogi et al. | |
| 7,554,186 B2 | 6/2009 | Kudo et al. | |
| 7,830,011 B2 | 11/2010 | Nomoto et al. | |
| 8,580,581 B2 | 11/2013 | Sekine et al. | |
| 8,592,952 B2 | 11/2013 | Jo et al. | |
| 2011/0115078 A1 | 5/2011 | Jeong et al. | |
| 2013/0037942 A1* | 2/2013 | Hwang | H01L 24/11 257/737 |
| 2014/0070385 A1* | 3/2014 | Tan | H01L 23/49562 257/666 |

(Continued)

FOREIGN PATENT DOCUMENTS

| | | |
|---|---|---|
| JP | 06-112270 A | 4/1994 |
| JP | 07-078828 A | 3/1995 |

(Continued)

*Primary Examiner* — Mamadou Diallo
(74) *Attorney, Agent, or Firm* — Lee & Morse, P.C.

(57) ABSTRACT

A semiconductor device includes a first semiconductor chip adjacent a second semiconductor chip. The first semiconductor chip includes a first surface and a second surface. The second semiconductor chip includes a third surface and a fourth surface. The third surface faces the second surface. A first through-electrode and a second through-electrode are between the first and second surfaces. A third through-electrode is between the third surface and the fourth surface and is connected to the first through-electrode. A fourth through-electrode is between the third surface and the fourth surface and is connected to the second through-electrode. An end of the first through-electrode has a first magnetic polarity on the second surface, and an end of the second through-electrode has a second magnetic polarity opposite to the first magnetic polarity on the second surface.

20 Claims, 23 Drawing Sheets

(56) References Cited

U.S. PATENT DOCUMENTS

2015/0048520 A1    2/2015  Skinner et al.
2016/0211243 A1*  7/2016  Suwada ............... H01L 25/0657
2017/0040278 A1*  2/2017  Hattori .................... H01L 24/17

FOREIGN PATENT DOCUMENTS

| JP | 10-112477 A | 4/1998 |
|---|---|---|
| JP | 2005-268623 A | 9/2005 |
| JP | 2010-199113 A | 9/2010 |
| KR | 10-2005-0069938 A | 7/2005 |
| WO | WO 2005/122706 A2 | 12/2005 |

* cited by examiner

SEMICONDUCTOR DEVICE WITH MAGNETICALLY ALIGNED CHIPS AND METHOD FOR FABRICATING THE SAME

CROSS-REFERENCE TO RELATED APPLICATION

Korean Patent Application No. 10-2015-0171793, filed on Dec. 3, 2015, and entitled, "Semiconductor Device and Method for Fabricating the Same," is incorporated by reference herein in its entirety.

BACKGROUND

1. Field

One or more embodiments described herein relate to a semiconductor device and a method for fabricating a semiconductor device.

2. Description of the Related Art

A continuing trend in the electronics industry is to manufacture products that are smaller and lighter and that operate at higher speed and performance at low cost. In an attempt to achieve these goals, multi-chip stacked package technology and a system in package technology have been developed. Both use through-vias in a substrate.

In an attempt to increase integration, scaling down techniques have been performed. These techniques include attempting to reduce the distances between through-vias in a substrate. In the case of multi-chip stacking, optical methods have been used. However, these methods produce misalignment. Also, the amount by which the spacing between through-vias can be reduced is limited.

SUMMARY

In accordance with one or more embodiments, a semiconductor device includes a first semiconductor chip including first and second surfaces; a second semiconductor chip including a third surface and a fourth surface, the third surface facing the second surface; a first through-electrode and a second through-electrode between the first surface and the second surface; a third through-electrode between the third surface and the fourth surface and connected to the first through-electrode; and a fourth through-electrode between the third surface and the fourth surface and connected to the second through-electrode, wherein an end of the first through-electrode has a first magnetic polarity on the second surface, and an end of the second through-electrode has a second magnetic polarity opposite the first magnetic polarity on the second surface.

In accordance with one or more other embodiments, a semiconductor device includes a first semiconductor chip including a first surface and a second surface; a second semiconductor chip including a third surface and a fourth surface, the third surface facing the second surface; a first bump on the second surface and projecting farther than the second surface; a second bump on the second surface and projecting farther than the second surface; a third bump on the third surface to project farther than the third surface and connected to the first bump; and a fourth bump on the third surface to project farther than the third surface and connected to the second bump, wherein a direction of a magnetic field in the first bump is different from a direction of a magnetic field in the second bump.

In accordance with one or more other embodiments, a semiconductor device includes a first bump; a second bump; a first chip including a first electrode coupled to the first bump; and a second chip including a second electrode coupled to the second bump, wherein the first bump is connected to the second bump and wherein the first bump has different magnetic polarity directions than the second bump.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
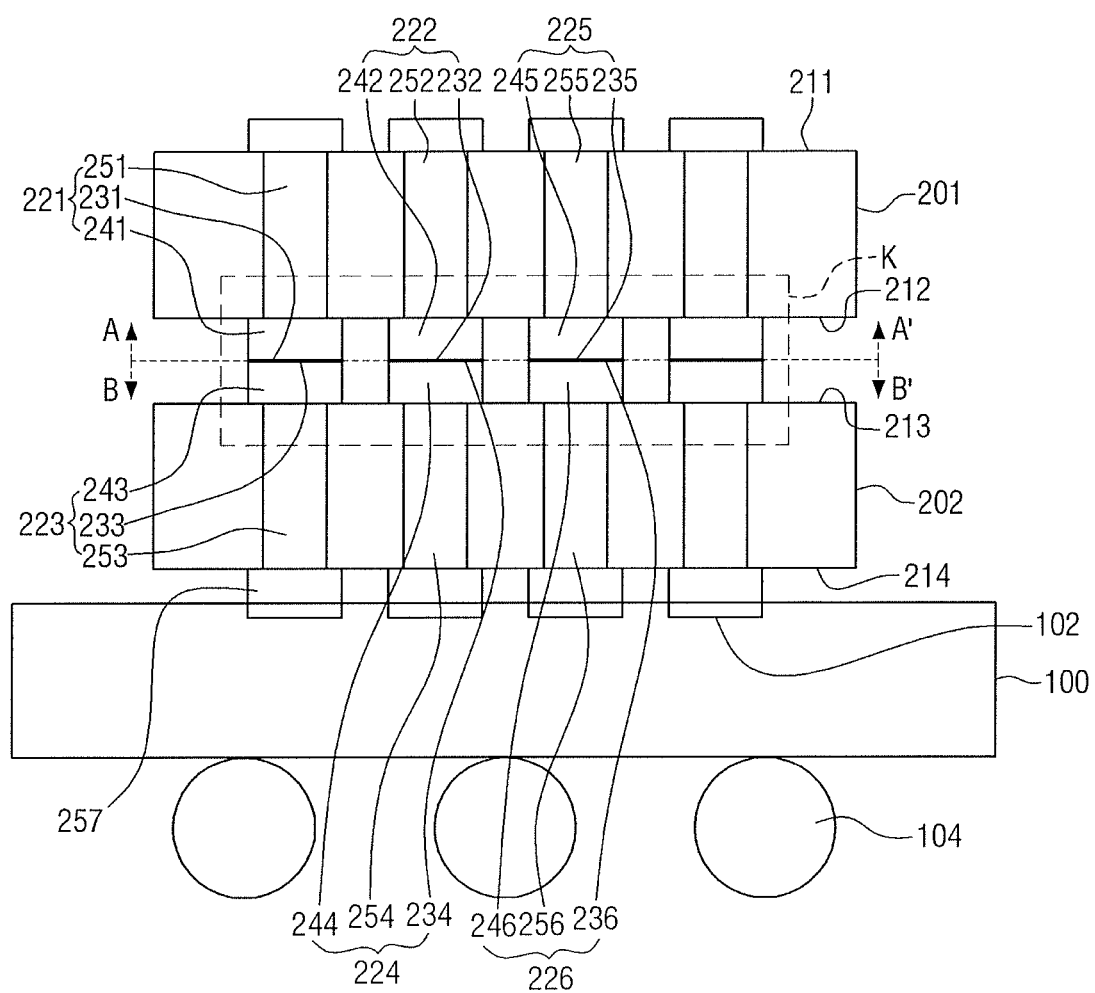
FIG. 1 illustrates an embodiment of a semiconductor device.

FIG. 1 illustrates an embodiment of a semiconductor device which may include a package substrate 100, a first semiconductor chip 201, a second semiconductor chip 202, and first to fourth through-electrodes 221 to 224.

The package substrate 100 may be a substrate for a package. For example, the package substrate 100 may be a printed circuit board (PCB) or a ceramic substrate. The package substrate 100 may include an upper surface and a lower surface. External terminals 104 may be on the lower surface of the package substrate 100. The external terminals 104 may electrically connect the semiconductor device to an external device.

Bonding pads 102 may be electrically connected to the external terminals 104 connected to the external device. The bonding pads 102 may supply electrical signals to the second semiconductor chip 202 and the first semiconductor chip 201. At least one of the bonding pads 102 (e.g., a ground pad) may be electrically connected to a ground line in the package substrate 100. The bonding pads 102 are arranged on a center portion of the package substrate 100. In another embodiment, the bonding pads 102 may be arranged at another portion of the package substrate 100. Also, the bonding pads 102 are illustrated to be spherical in shape. In another embodiment, the bonding pads 102 may have a different shape, for example, based on the semiconductor device fabricating process used.

The first semiconductor chip 201 and the second semiconductor chip 202 may be arranged to overlap each other on the package substrate 100. For example, the first semiconductor chip 201 and the second semiconductor chip 202 may be successively stacked on the package substrate 100. In one embodiment, the second semiconductor chip 202 may entirely overlap the first semiconductor chip 201 that is electrically connected to the second semiconductor chip 202.

The first semiconductor chip 201 may include a first surface 211 and a second surface 212. The second semiconductor chip 202 may include a third surface 213 and a fourth surface 214. The third surface 213 of the second semiconductor chip 202 may face the second surface 212 of the first semiconductor chip 201.

The first semiconductor chip 201 and the second semiconductor chip 202 may be, for example, memory chips or logic chips. When the first semiconductor chip 201 and/or the second semiconductor chip 202 are logic chips, the first semiconductor chip 201 and/or the second semiconductor chip 202 may be designed in various ways in consideration of their operations.

When the first semiconductor chip 201 and/or the second semiconductor chip 202 are memory chips, the memory chips may be, for example, nonvolatile memory chips, e.g., flash memory chips such as NAND and/or NOR flash memory chips. In some embodiments, the memory chips may include a PRAM (Phase-change Random-Access Memory), MRAM (Magneto-resistive Random-Access Memory), and/or RRAM (Resistive Random-Access Memory), or another type of memory.

The second semiconductor chip 202 may be electrically connected to the package substrate 100 by a third-prime projection portion 257 on the fourth surface 214 of the second semiconductor chip 202. For example, the third-prime projection portion 257 may electrically connect the second semiconductor chip 202 and the bonding pad 102 of the package substrate 100 to each other. The third-prime projection portion 257 may be rectangular in shape or may have another shape. For example, the third-prime projection portion 257 may be a ball-type solder ball or may be a solder-bump type in which a pillar and a solder ball are combined with each other.

The third-prime projection portion 257 is connected to the package substrate 100 and may include a magnetic material or a non-magnetic material.

The third-prime projection portion 257 that bonds the package substrate 100 and the second semiconductor chip 202 to each other may be positioned between the package substrate 100 and the second semiconductor chip 202. Accordingly, the second semiconductor chip 202 may be arranged to be spaced apart from the package substrate 100. For example, the upper surface of the package substrate 100 may be spaced apart from the fourth surface 214 of the second semiconductor chip 202, at least as long as the height of the third-prime projection portion 257.

The first semiconductor chip 201 and the second semiconductor chip 202 may be, for example, in the form of a flip chip or another type of chip. The third-prime projection portion 257 may be on a surface on which a semiconductor device circuit is formed or another surface.

The first semiconductor chip 201 and the second semiconductor chip 202 are illustrated to be single chips. In another embodiment, one or more of the first and second semiconductor chips may include multiple chips.

The first semiconductor chip 201 may be electrically connected to the package substrate 100 through the third through-electrode 223 and the fourth through-electrode 224 in the second semiconductor chip 202. For example, the first semiconductor chip 201 may be electrically connected to the package substrate 100 through the first through-electrode 221 and the third through-electrode 223.

The first semiconductor chip 201 may include the first through-electrode 221 and the second through-electrode 222 that extend between the first surface 211 and the second surface 212. FIG. 1 illustrates that four through-electrodes are formed in the first semiconductor chip 201. However, a different number of through-electrodes may be formed in the first semiconductor chip 201 in another embodiment.

The first through-electrode 221 may include a first body portion 251 and a first projection portion 241. The second through-electrode 222 may include a second body portion 252 and a second projection portion 242.

The first body portion 251 and the second body portion 252 may be formed inside the first semiconductor chip 201. In some embodiments, the first body portion 251 and the second body portion 252 may be TSVs (Through Silicon Vias). The first body portion 251 and the second body portion 252 are illustrated to have a slope perpendicular to the second surface 212 of the first semiconductor chip 201. In another embodiment, the first body portion 251 and the second body portion 252 may have slopes with respect to the second surface 212 of the first semiconductor chip 201.

The first projection portion 241 may be connected to the first body portion 251. The second projection portion 242 may be connected to the second body portion 252. The first projection portion 241 and the second projection portion 242 may project farther than the second surface 212 of the first semiconductor chip 201. In some embodiments, the first projection portion 241 and the second projection portion 242 may be bumps.

In FIG. 1, the first projection portion 241 and the second projection portion 242 are illustrated to have a rectangular shape. In another embodiment, for example, the first projection portion 241 and the second projection portion 242 may have other shapes depending, for example, on the semiconductor device fabricating process used.

The first through-electrode 221 may include a first end 231 of the first through-electrode 221 on the second surface 212 of the first semiconductor chip 201. For example, the first end 231 of the first through-electrode 221 may be an end of the first projection portion 241. When the first projection portion 241 is directly connected to the third projection portion 243, the first end 231 of the first through-electrode 221 may be a boundary on which the third projection portion 243 of the third through-electrode 223 and the first projection portion 241 meet each other.

The second through-electrode 222 may include a second end 232 of the second through-electrode 222 on the second surface 212 of the first semiconductor chip 201. For example, the second end 232 of the second through-electrode 222 may be an end of the second projection portion 242. When the second projection portion 242 is directly connected to the fourth projection portion 244 to be described later, the second end 232 of the second through-electrode 222 may be a boundary on which the fourth projection portion 244 of the fourth through-electrode 224 and the second projection portion 242 meet each other.

Figure 2:
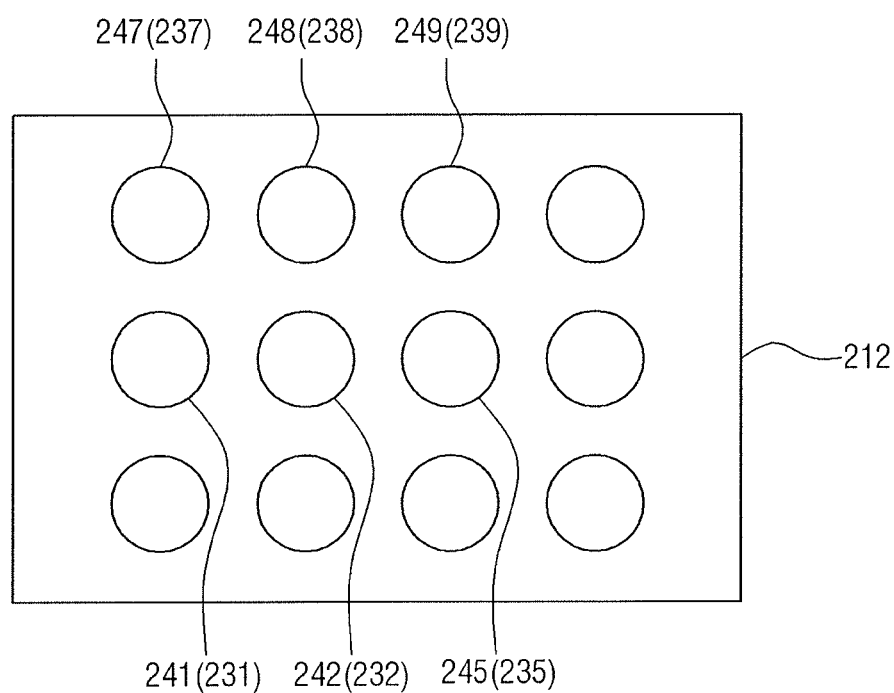
FIG. 2 illustrates a view taken along section line A-A' in FIG. 1.

Referring to FIG. 2, the first semiconductor chip 201 may include a fifth through-electrode 225 and seventh to ninth through-electrodes that extend between the first surface 211 and the second surface 212.

In the same manner as the first through-electrode 221 and the second through-electrode 222, the fifth through-electrode 225 and the seventh to ninth through-electrodes may include a fifth projection portion 245 and seventh to ninth projection portions 247 to 249, respectively. Further, in the same manner as the first through-electrode 221 and the second through-electrode 222, the fifth end 235 and the seventh to ninth ends 237 to 239 may be ends of the fifth projection portion 245 and the seventh to ninth projection portions 247 to 249, respectively.

In some embodiments, on the second surface 212 of the first semiconductor chip 201, the first end 231 of the first through-electrode 251 may have a first magnetic polarity. On the second surface 212 of the first semiconductor chip 201, the second end 232 of the second through-electrode 252 may have a second magnetic polarity. The first magnetic polarity and the second magnetic polarity may be opposite to each other. For example, if the first magnetic polarity is N, the second magnetic polarity may be S. If the first magnetic polarity is S, the second magnetic polarity may be N.

In some embodiments, if the first end 231 of the first through-electrode 221 has the first magnetic polarity on the second surface 212, the fifth end 235 of the fifth through-electrode 225 may have, for example, the first magnetic polarity on the second surface 212. In this case, only the second through-electrode 222 having the second magnetic polarity may be between the first through-electrode 221 and the fifth through-electrode 225.

The seventh end 237 of the seventh through-electrode may have, for example, the second magnetic polarity on the second surface 212. In this case, any through-electrode that has an end having the magnetic polarity may not be between the first through-electrode 221 and the seventh through-electrode.

The eighth end 238 of the eighth through-electrode may have, for example, the first magnetic polarity on the second surface 212. In this case, any through-electrode that has an end having the magnetic polarity may not be arranged between the seventh through-electrode and the eighth through-electrode. Further, any through-electrode that has an end having the magnetic polarity may not be arranged between the second through-electrode 222 and the eighth through-electrode.

The ninth end 239 of the ninth through-electrode may have, for example, the second magnetic polarity on the second surface 212. In this case, any through-electrode that has an end having the magnetic polarity may not be between the eighth through-electrode and the ninth through-electrode. Further, any through-electrode that has an end having the magnetic polarity may not be between the fifth through-electrode 225 and the ninth through-electrode.

In the semiconductor device of the present embodiment, through-electrodes having opposite polarities may be arranged to cross each other. For example, a through-electrode that has an end with the magnetic polarity may not be formed between the first through-electrode 221 and the second through-electrode 222. Accordingly, in one embodiment of the semiconductor device, bumps formed on the semiconductor chips that are vertically stacked have the magnetic polarities. Thus, the semiconductor chips may be self-aligned using an attractive force of a magnetic body. Further, since the magnetic material is in the bump, the distance between the vias and the size of the bump may be reduced. Thus, integrity of the semiconductor device may be improved.

In some embodiments, if the first end 231 of the first through-electrode 221 has the first magnetic polarity on the second surface 212 and the second end 232 of the second through-electrode 222 has the second magnetic polarity on the second surface 212, the fifth end 235 of the fifth through-electrode 225 may have a third magnetic polarity. The third magnetic polarity may be different from the first magnetic polarity and the second magnetic polarity. The third magnetic polarity may be, for example, a non-magnetic polarity or neutral.

At least one of the seventh end 237 of the seventh through-electrode to the ninth end 239 of the ninth through-electrode may have the third magnetic polarity. For example, the seventh end 237 of the seventh through-electrode to the ninth end 239 of the ninth through-electrode may all have the third magnetic polarity.

In some embodiments, if the first end 231 of the first through-electrode 221 has the first magnetic polarity or the second magnetic polarity, the second end 232 of the second through-electrode 222 may have the third magnetic polarity. In this case, the fifth end 235 and the seventh to ninth ends 237 to 239 may all have, for example, the third magnetic polarity.

In some embodiments, if the first end 231 of the first through-electrode 221 has the first magnetic polarity or the second magnetic polarity, any one of the second end 232, the fifth end 235, or the seventh to ninth ends 237 to 239 may have any one of the first magnetic polarity, the second magnetic polarity, or the third magnetic polarity. For example, if the first end 231 has the first magnetic polarity, the second end 232, the fifth end 235, the seventh end 237, and the eighth end 238 may have the third magnetic polarity, and the ninth end 239 may have the first magnetic polarity or the second magnetic polarity.

Thus, in the present embodiment, at least one of a plurality of through-electrodes may have an end with magnetic polarity and the remainders thereof may have non-magnetic polarity. Moreover, only parts of a plurality of bumps may have magnetic polarity. Thus, semiconductor chips that are vertically stacked may be self-aligned. In other words, as long as at least some of the bumps have polarities opposite each other in respective chips, the chips may be self-aligned.

Referring again to FIG. 1, the first body portion 251 may include a material different from the material of the first projection portion 241. In some embodiments, the first projection portion 241 may include a first magnetic material.

If the first projection portion 241 includes the first magnetic material, the first body portion 251 may include, for example, a non-magnetic material. If the first body portion 251 includes the non-magnetic material, only the first projection portion 241 of the first through-electrode 221 may have magnetism.

Figure 6:
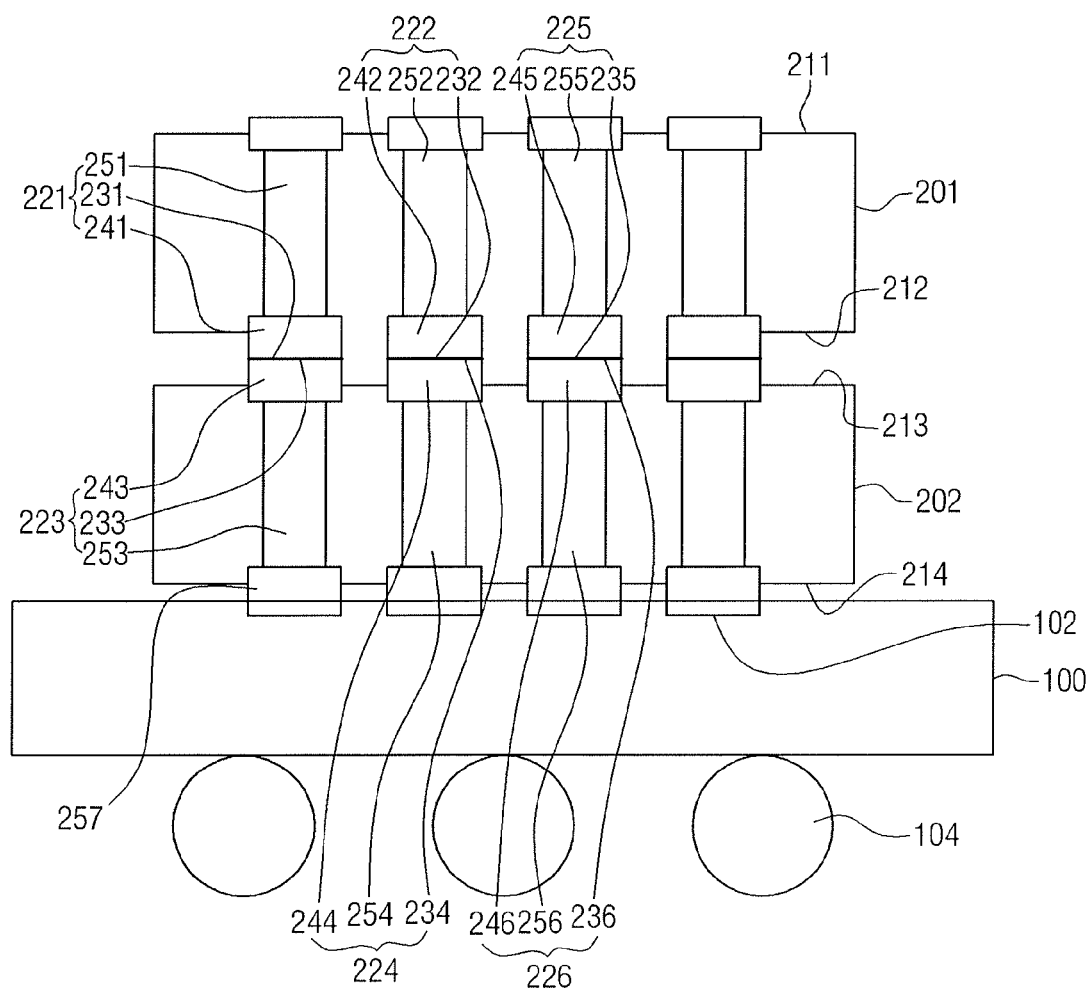
FIG. 6 illustrates another embodiment of a semiconductor device.

Referring to FIG. 6, the first body portion 251 may include, for example, the first magnetic material in the first projection portion 241. Thus, the body portion and the projection portion may include the same magnetic material. If the first body portion 251 includes the first magnetic material, the first through-electrode 221 may have magnetism as a whole.

On the other hand, the first body portion 251 may include, for example, a second magnetic material different from the first magnetic material in the first projection portion 241. If the first body portion 251 includes the second magnetic material, the first through-electrode 221 may have magnetism as a whole.

The first magnetic material or the second magnetic material may include a material having magnetism, for example, at least one of a ferromagnetic material, a ferrimagnetic material, a soft magnetic material, or graphene.

The ferromagnetic material may be, for example, nickel (Ni), cobalt (Co), iron (Fe), or a combination thereof.

The ferrimagnetic material may include, for example, magnetite or a ferrite material. The ferrite material may include iron oxide (FeO, $Fe_2O_3$, $Fe_2O_4$, or $Fe_3O_4$) and at least one metal. The metal that is used in combination with the iron oxide may include, for example, nickel (Ni) zinc (Xn), manganese (Mn), cobalt (Co), magnesium (Mg), aluminum (Al), barium (Ba), copper (Cu), and iron (Fe). The ferrite material may have high resistivity and low saturation magnetization. Further, the ferrite material may have low mechanical strength, and thus may be used in combination with a metal.

The soft magnetic material may include, for example, soft magnetic metal powder or soft magnetic alloy powder. Further, the first magnetic material or the second magnetic material may include a metallic magnetic material. In one embodiment, the first magnetic material or the second magnetic material may include, for example, a material that does not continuously generate magnetism, but generates magnetism only when a magnetism generator is turned on to generate magnetic force.

The non-magnetic material may include, for example, aluminum, brass, platinum, copper (Cu), or tin. In one embodiment, the non-magnetic material may include, for example, a material that is not affected by a magnetic field and, thus, is not magnetized.

The second semiconductor chip 202 may include the third through-electrode 223 and the fourth through-electrode 224 that extend between the third surface 213 and the fourth surface 214. FIG. 1 illustrates the example where four through-electrodes are inside the second semiconductor chip 202. A different number of through-electrodes may be inside the second semiconductor chip 202 in another embodiment.

The third through-electrode 223 may include the third body portion 253 and the third projection portion 243. The fourth through-electrode 224 may include the fourth body portion 254 and the fourth projection portion 244. The third body portion 253 and the fourth body portion 254 may be inside the second semiconductor chip 202. The third body portion 253 and the fourth body portion 254 may have substantially the same shape and material as the first body portion 251 and the second body portion 254.

The third projection portion 243 may be connected to the third body portion 253. The fourth projection portion 244 may be connected to the fourth body portion 254. The third projection portion 243 and the fourth projection portion 244 may project farther than the third surface 213 of the second semiconductor chip 202. In some embodiments, the third projection portion 243 and the fourth projection portion 244 may be bumps. The third projection portion 243 and the fourth projection portion 244 may have substantially the same shape and material as the first projection portion 241 and the second projection portion 242.

The third through-electrode 223 may include the third end 233 on the third surface 213 of the second semiconductor chip 202. For example, the third end 233 of the third through-electrode 223 may be an end of the third projection portion 243.

The fourth through-electrode 224 may include the fourth end 234 on the third surface 213 of the second semiconductor chip 202. For example, the fourth end 234 of the fourth through-electrode 224 may be an end of the fourth projection portion 244.

The first through-electrode 221 may be connected to the third through-electrode 223. The second through-electrode 222 may be connected to the fourth through-electrode 224. In one embodiment, the first semiconductor chip 201 and the second semiconductor chip 202 may be electrically connected to each other through connection of the first projection portion 241 and the third projection portion 243 to each other. Further, the first semiconductor chip 201 and the second semiconductor chip 202 may be electrically connected through connection of the second projection portion 242 and the fourth projection portion 244 to each other.

Figure 3:
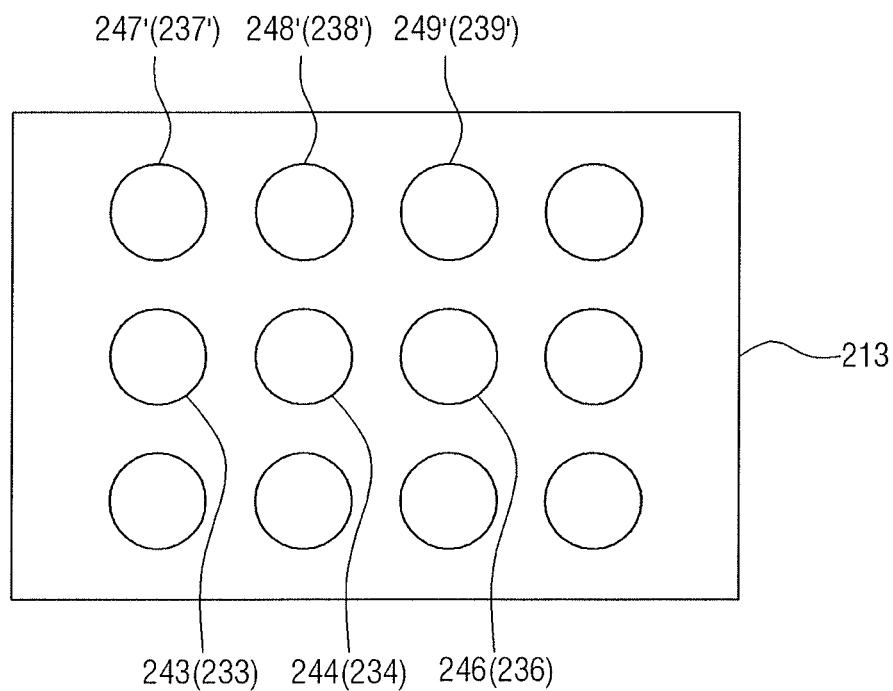
FIG. 3 illustrates a view taken along section line B-B' in FIG. 1.

Referring to FIG. 3, the second semiconductor chip 202 may include a sixth through-electrode 226 and tenth to twelfth through-electrodes that extend between the third surface 213 and the fourth surface 214. In the same manner as the third through-electrode 223 and the fourth through-electrode 224, the sixth through-electrode 226 and the tenth to twelfth through-electrodes may include a sixth projection portion 246 and tenth to twelfth projection portions 247' to 249'. Further, in the same manner as the third electrode 223 and the fourth through-electrode 224, a sixth end 236 and tenth to twelfth ends 237' to 239' may be the ends of the sixth projection portion 246 and the tenth to twelfth projection portions 247' to 249'.

In some embodiments, the third end 233 of the third through-electrode 253 on the third surface 213 of the second semiconductor chip 202 may have a magnetic polarity opposite to the magnetic polarity of the first end 231 of the first through-electrode 251 on the second surface 212 of the first semiconductor chip 201. For example, if the first end 231 has the first magnetic polarity, the third end 233 may have the second magnetic polarity.

The fourth end 234 of the fourth through-electrode 254 on the third surface 213 of the second semiconductor chip 202 may have a magnetic polarity opposite to the magnetic polarity of the second end 232 of the second through-electrode 251 on the second surface 212 of the first semiconductor chip 201. For example, if the second end 232 has the second magnetic polarity, the fourth end 234 may have the first magnetic polarity.

Figure 4:
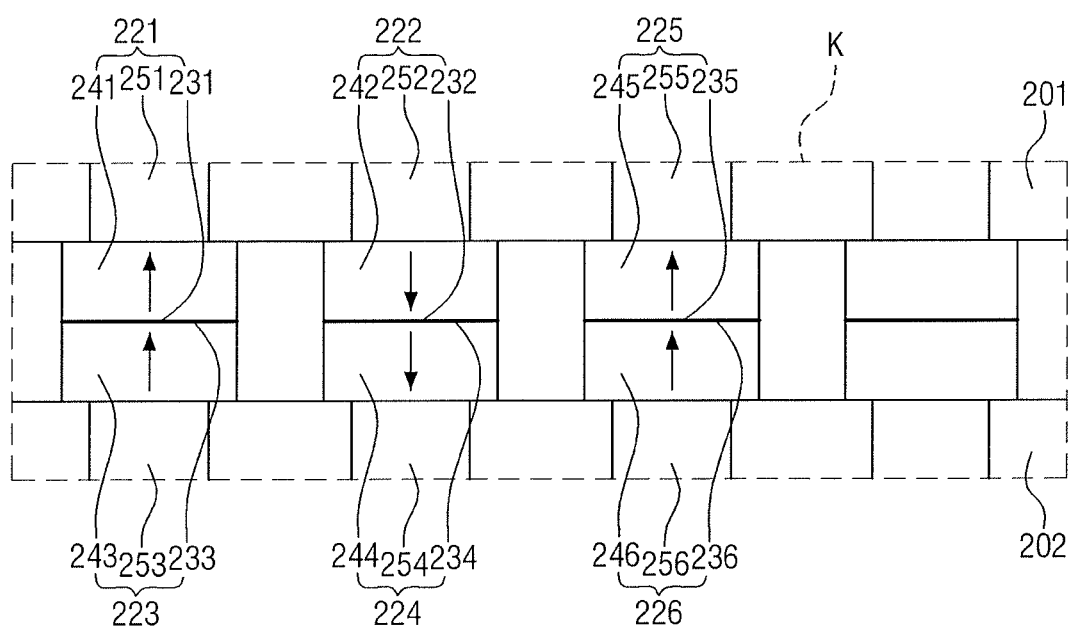
FIGS. 4 and 5 illustrate enlarged views of a surface K in FIG. 1.

Referring to FIG. 4, if the direction of a magnetic field in the first projection portion 241 is directed upward on the basis of the package substrate 100, the direction of a magnetic field in the third projection portion 243 that is to be connected to the first projection portion 241 may also be directed upward on the basis of the package substrate 100. Further, since the direction of the magnetic field in the first projection portion 241 is directed upward on the basis of the package substrate 100, in one embodiment the direction of the magnetic field in the second projection portion 242 may be directed downward on the basis of the package substrate 100. Further, the direction of the magnetic field in the fourth projection portion 244 connected to the second projection portion 242 may be directed downward on the basis of the package substrate 100.

Referring again to FIG. 3, if the third end 233 of the third through-electrode 223 on the third surface 213 has the second magnetic polarity, the sixth end 236 of the sixth through-electrode 226 on the third surface 213 may have, for example, the second magnetic polarity. In this case, only the fourth through-electrode 224 having the first magnetic polarity may be arranged between the third through-electrode 223 and the sixth through-electrode 226.

The tenth projection portion 247' of the tenth through-electrode may be connected to the seventh projection portion 247 of the seventh through-electrode. The tenth end 237' of the tenth through-electrode on the third surface 213 may have, for example, the first magnetic polarity. In this case, any through-electrode that has an end having the magnetic polarity may not be arranged between the third through-electrode 223 and the tenth through-electrode.

The eleventh projection portion 248' of the eleventh through-electrode may be connected to the eighth projection portion 248 of the eighth through-electrode. The eleventh end 238' of the eleventh through-electrode on the third surface 213 may have, for example, the second magnetic polarity. In this case, any through-electrode that has an end having the magnetic polarity may not be arranged between the tenth through-electrode and the eleventh through-electrode. Further, any through-electrode that has an end having the magnetic polarity may not be arranged between the fourth through-electrode 224 and the eleventh through-electrode.

The twelfth projection portion 249' of the twelfth through-electrode may be connected to the ninth projection portion 249 of the ninth through-electrode. The twelfth end 239' of the twelfth through-electrode on the third surface 213 may have, for example, the first magnetic polarity. In this case, any through-electrode that has an end having the magnetic polarity may not be arranged between the eleventh through-electrode and the twelfth through-electrode. Further, any through-electrode that has an end having the magnetic polarity may not be arranged between the sixth through-electrode 226 and the twelfth through-electrode.

Thus, in the semiconductor device according to one embodiment, through-electrodes having opposite polarities may be arranged to cross each other. For example, the through-electrode that has an end with the magnetic polarity may not be formed between the third through-electrode 223 and the fourth through-electrode 224.

In some embodiments, if the third end 233 of the third through-electrode 223 on the third surface 213 has the second magnetic polarity and the fourth end 234 of the fourth through-electrode 224 on the third surface 213 has the first magnetic polarity, the sixth end 236 of the sixth through-electrode 226 on the third surface 213 may have the third magnetic polarity.

Figure 5:
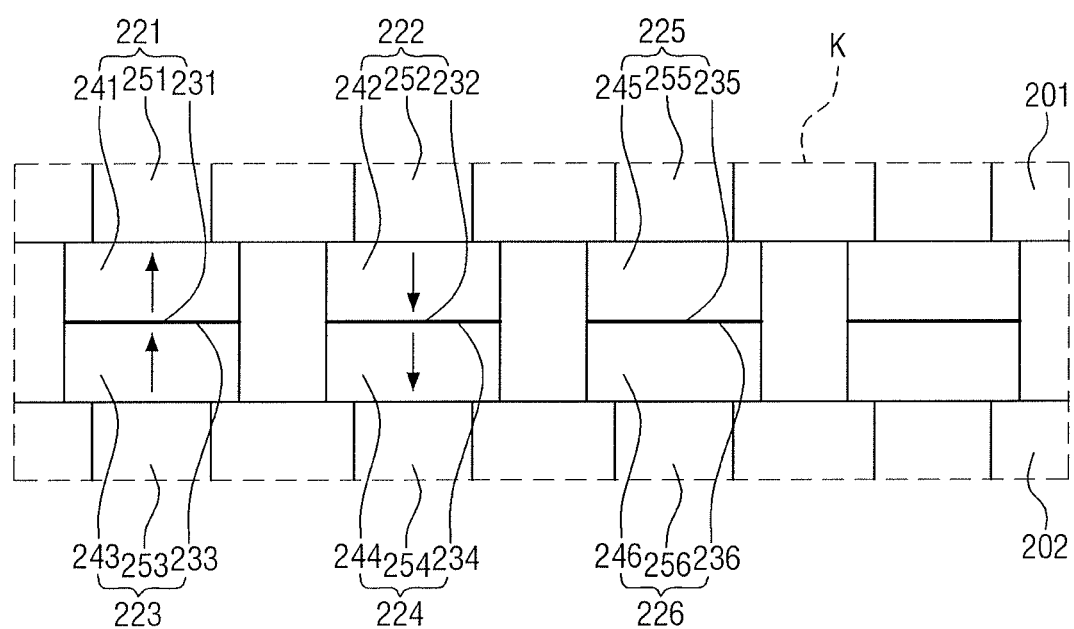

Referring to FIG. 5, even if the first to fourth projection portions 241 to 244 have the direction of a specific magnetic field therein, the fifth projection portion 245 and the sixth projection portion 246 may not have the direction of the magnetic field.

At least one of the tenth end 237' of the tenth through-electrode to the twelfth end 239' of the twelfth through-electrode may have the third magnetic polarity. For example, the tenth end 237' of the tenth through-electrode to the twelfth end 239' of the twelfth through-electrode may have the third magnetic polarity in all.

In some embodiments, if the third end 233 of the third through-electrode 221 has the first magnetic polarity or the second magnetic polarity, the fourth end 234 of the fourth through-electrode 224 may have the third magnetic polarity. In this case, the sixth end 236 and the tenth end 237' of the tenth through-electrode to the twelfth end 239' of the twelfth through-electrode may have, for example, the third magnetic polarity in all.

In some embodiments, if the third end 233 of the third through-electrode 223 has the first magnetic polarity or the second magnetic polarity, any one of the fourth end 234, the sixth end 236, or the tenth to twelfth ends 237' to 239' may have any one of the first magnetic polarity, the second magnetic polarity, or the third magnetic polarity. For example, if the third end 233 has the first magnetic polarity, the fourth end 234, the sixth end 236, the tenth end 237', and the eleventh end 238' may have the third magnetic polarity, and the twelfth end 239' may have the first magnetic polarity or the second magnetic polarity.

Figure 7:
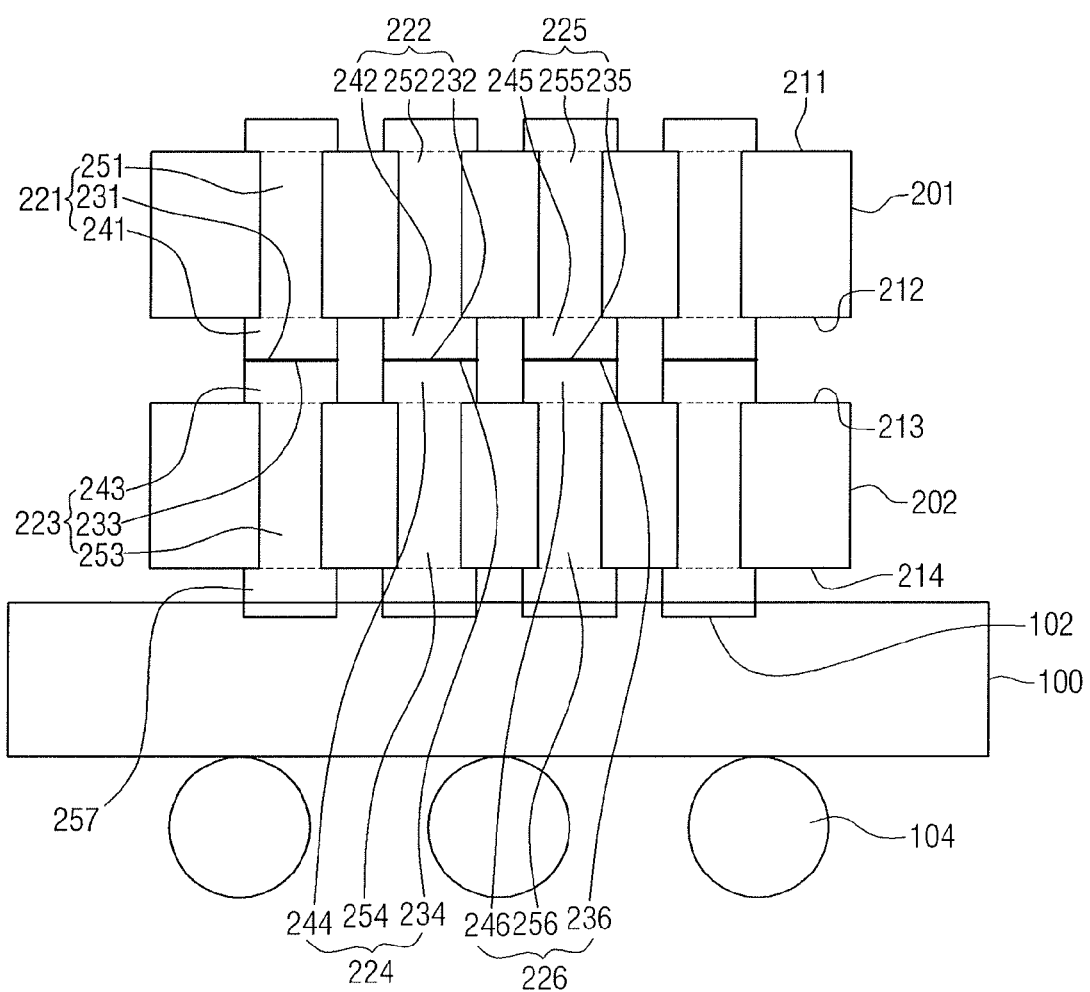
FIG. 7 illustrates another embodiment of a semiconductor device.

FIG. 7 illustrates another embodiment of a semiconductor device. Referring to FIG. 7, at least a part of the first projection portion 241, the second projection portion 242, and the fifth projection portion 245 may project farther than the second surface 212 of the first semiconductor chip 201. Further, at least a part of the third projection portion 243, the fourth projection portion 244, and the sixth projection portion 246 may project farther than the third surface 213 of the second semiconductor chip 202. Thus, unlike FIG. 1, part of the projection portion may be inside the semiconductor chip.

Figure 8:
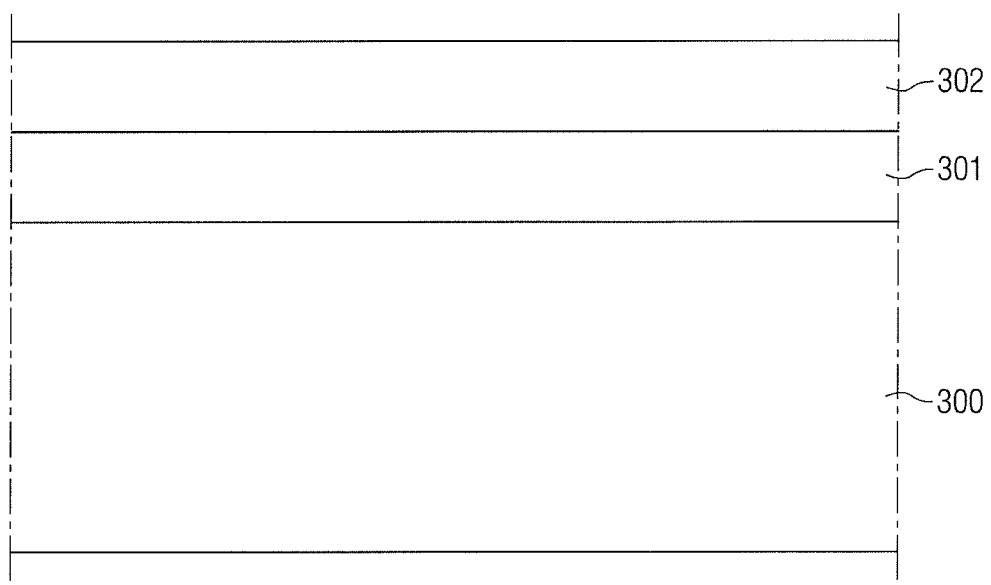
FIGS. 8 to 20 illustrate stages in various embodiments of a method for fabricating a semiconductor device.

FIGS. 8 to 15 illustrate various stages of an embodiment of a method for fabricating a semiconductor device. Referring to FIG. 8, an interlayer insulating layer 301 and a metal wiring layer 302 may be successively stacked on a substrate 300.

The substrate 300 may be made of, for example, bulk silicon or SOI (Silicon-On-Insulator). The substrate 300 may be a silicon substrate or may include a different material, for example, silicon germanium, indium antimonide, lead telluride, indium arsenide, indium phosphide, gallium arsenide, or gallium antimonide. The substrate 300 may be obtained by forming an epitaxial layer on a base substrate. The substrate 300 may include a field insulating layer formed of, for example, a material including at least one of silicon oxide, silicon nitride, or silicon oxynitride.

The interlayer insulating layer 301 may be formed on the substrate 300. In order to reduce a coupling phenomenon between wirings, the interlayer insulating layer 301 may include, for example, at least one of a low-k material, an oxide layer, a nitride layer, or an oxynitride layer. The low-k material may include, for example, FOX (Folwable Oxide). TOSZ (Toner SilaZen), USG (Undoped Silica Glass). BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (Bis-benzoCycloButenes), SiLK, polyimide, porous polymeric material, or a combination thereof.

The interlayer insulating layer 301 may be formed, for example, using chemical vapor deposition, spin coating, PECVD (Plasma Enhanced CVD), or HDP-CVD (High Density Plasma CVD).

The interlayer insulating layer 301 may include a transistor and a diode. For example, the interlayer insulating layer 301 may include a gate electrode of the transistor or a source/drain of the transistor. A circuit device may include a plurality of memory devices. Each memory device may be, for example, a volatile semiconductor memory device or a nonvolatile semiconductor memory device. The volatile semiconductor memory device may be, for example, a DRAM or an SRAM. The nonvolatile semiconductor memory device may be, for example, an EPROM, an EEPROM, or a flash EEPROM. The interlayer insulating layer 301 may be an FEOL (Front End Of Line) layer. The metal wiring layer 302 may include a metal wiring and, for example, may be a BEOL (Back End Of Line) layer.

Figure 9A:
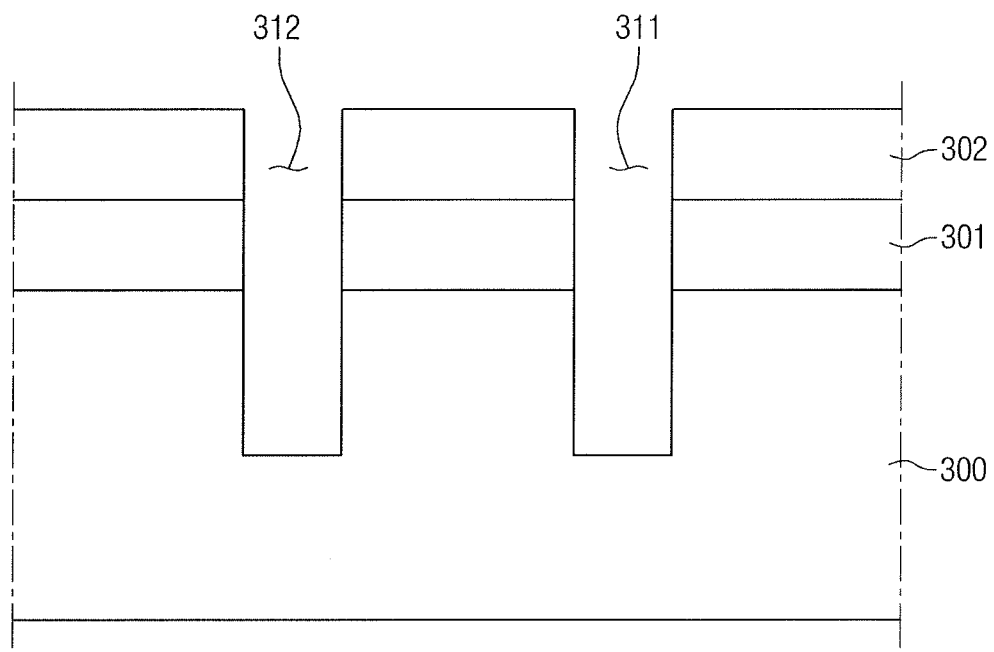

Referring to FIG. 9A, a first via hole 311 and a second via hole 312 may be formed to penetrate the interlayer insulating layer 301 and the metal wiring layer 302. The first via hole 311 and the second via hole 312 may extend into the substrate 300.

Figure 9B:
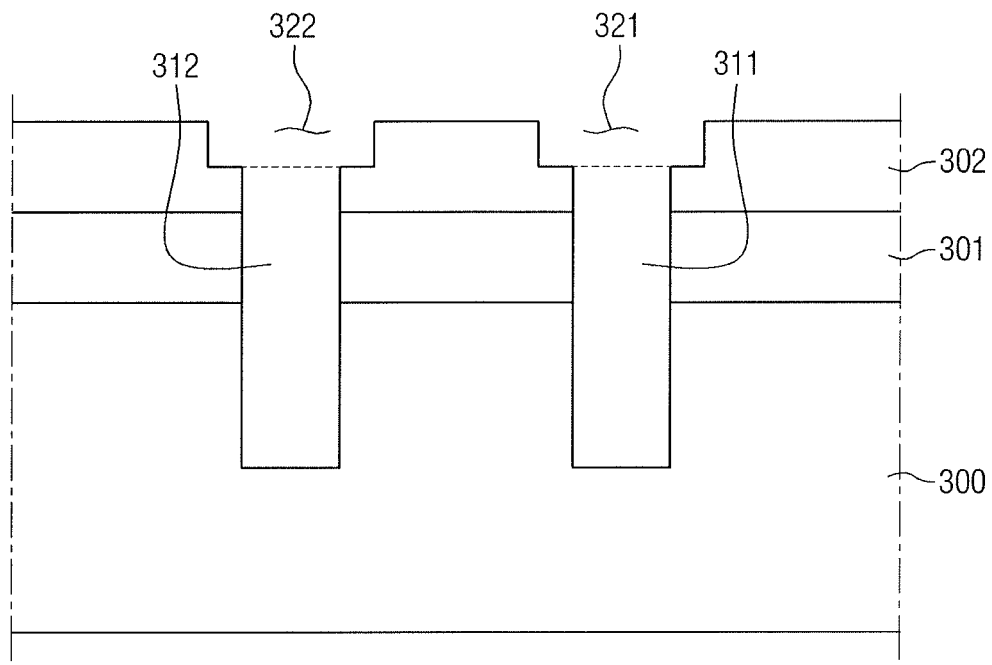

Referring to FIG. 9B, in some embodiments, after the first via hole 311 and the second via hole 312 are formed, a first trench 321 and a second trench 322 may be formed in the metal wiring layer 302. The width of the first trench 321 and the second trench 322 may be greater than the width of the first via hole 311 and the second via hole 312.

Figure 10:
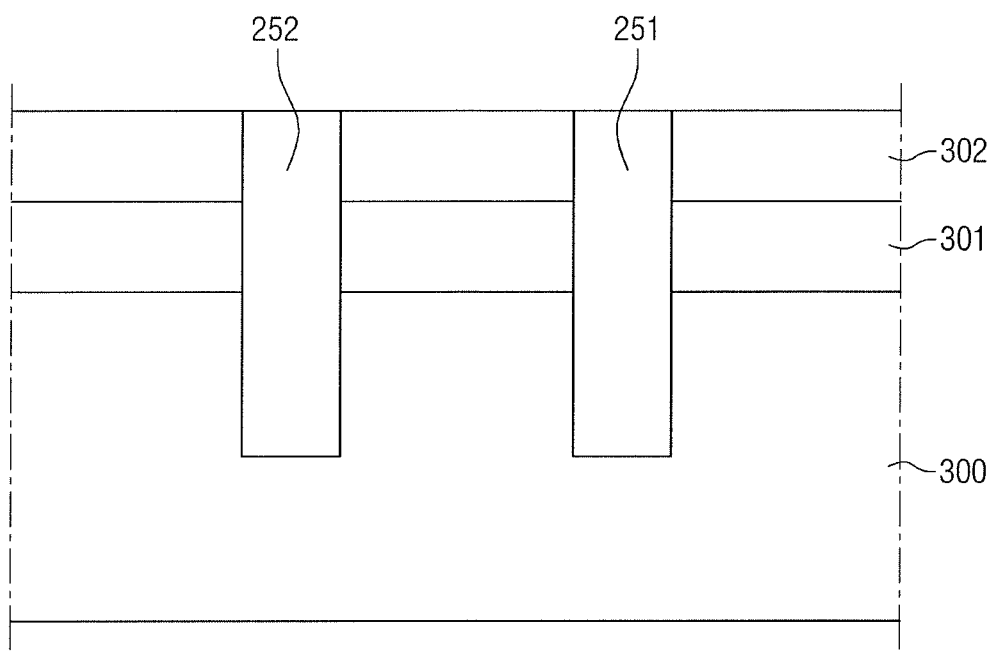

Referring to FIG. 10, a first body portion 251 and a second body portion 252 may be formed. The first body portion 251 and the second body portion 252 may be formed, for example, by filling the first via hole 311 and the second via hole 312 with a conductive material, a magnetic material, or a non-magnetic material.

Figure 11:
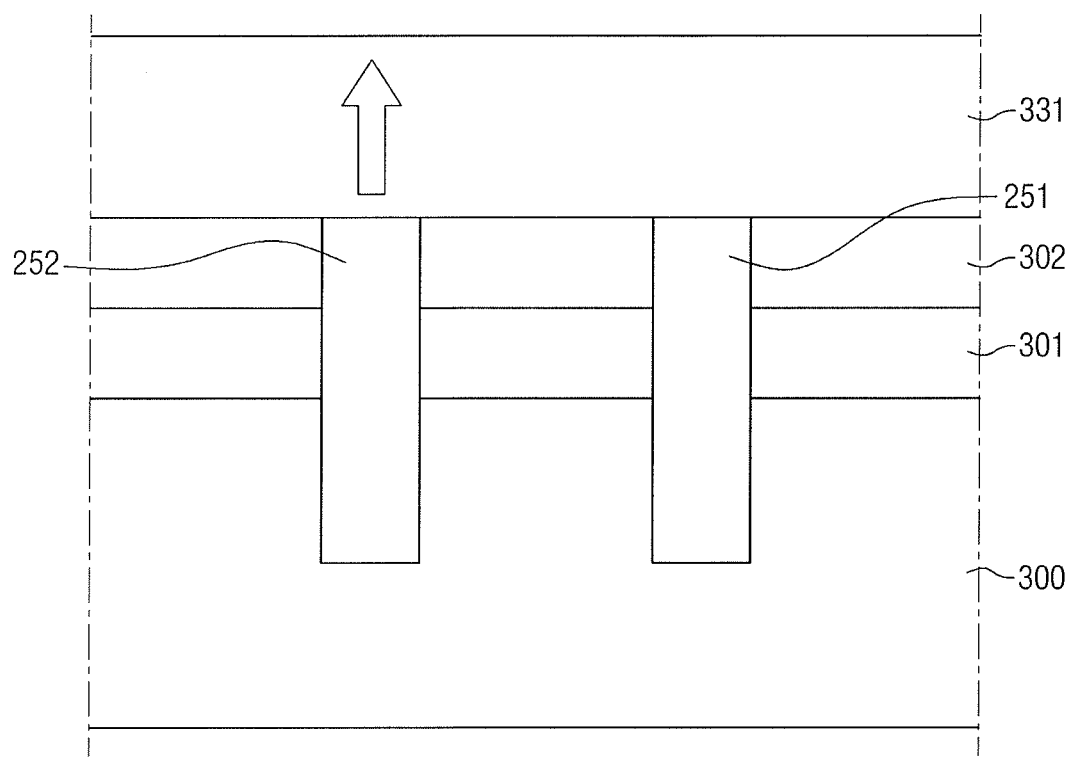

Referring to FIG. 11, a magnetic material 331 having a second magnetic polarity direction may be deposited on upper surfaces of the first body portion 251, the second body portion 252, and the metal wiring layer 302. In some embodiments, the magnetic material 331 having the second magnetic polarity direction may fill the first trench 321 and the second trench 322.

Figure 12:
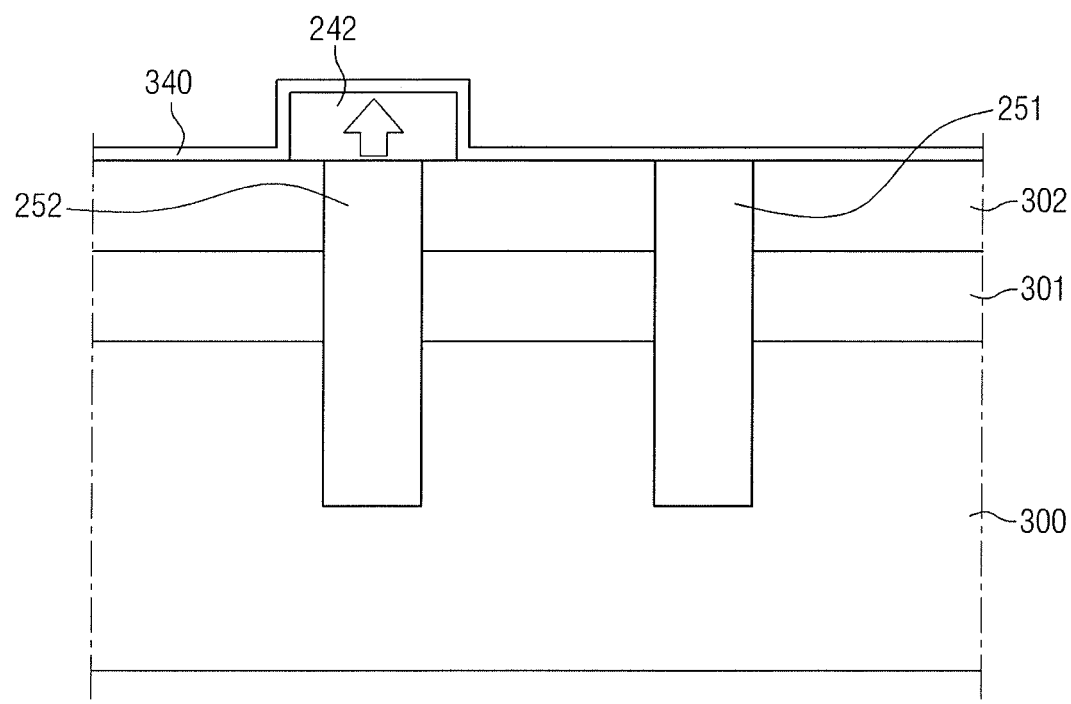

Referring to FIG. 12, a second projection portion 242 may be formed by patterning the magnetic material 331 having the second magnetic polarity direction, so that the magnetic material 331 remains only on an upper surface of the second body portion 252. In some embodiments, at least a part of the second projection portion 242 may be formed inside the metal wiring layer 302.

After the second projection portion 242 is formed, a separation layer 340 may be formed on an upper surface of the second projection portion 242 and an upper surface of the metal wiring layer 302. In some embodiments, the separation layer 340 may be formed conformally formed inside the first trench 321.

Figure 13:
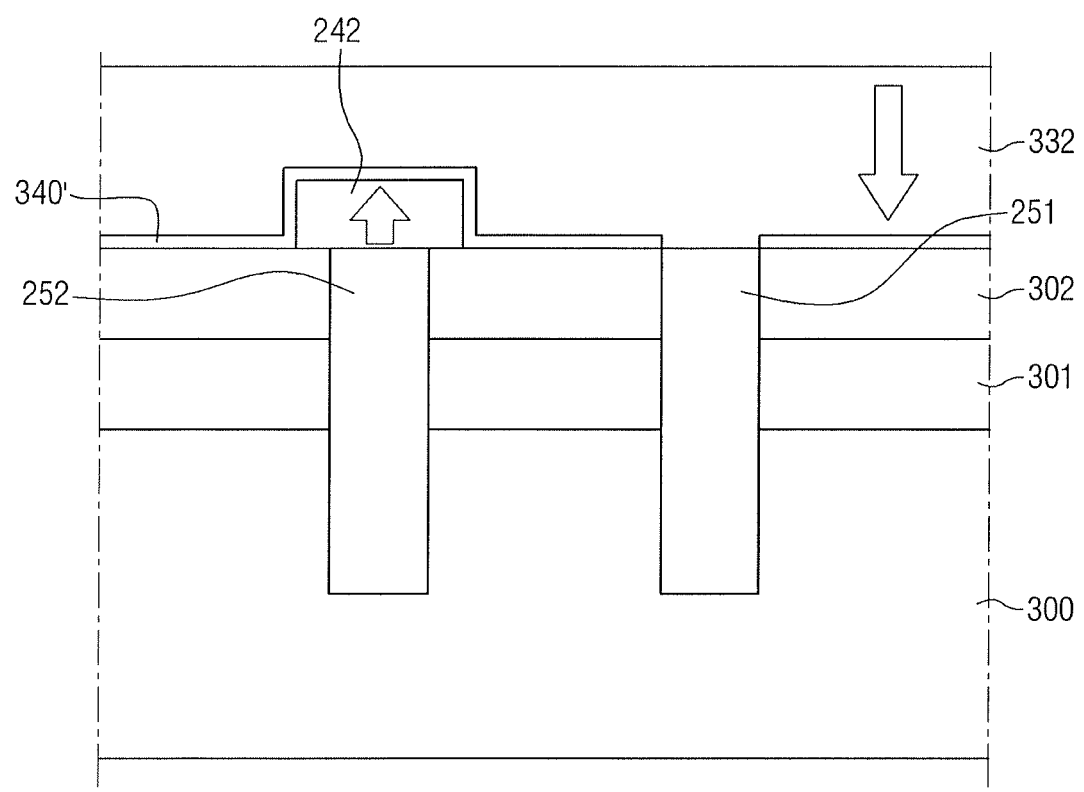

Referring to FIG. 13, a separation layer pattern 340' may be formed by exposing an upper surface portion of the first body portion 251. A magnetic material 332 having the first magnetic polarity direction may be deposited on an upper surface of the separation layer pattern 340' and an upper surface of the first body portion 251 that is exposed due to formation of the separation layer pattern 340'. In some embodiments, the magnetic material 332 having the first magnetic polarity direction may be deposited to fill the first trench 321.

Figure 14:
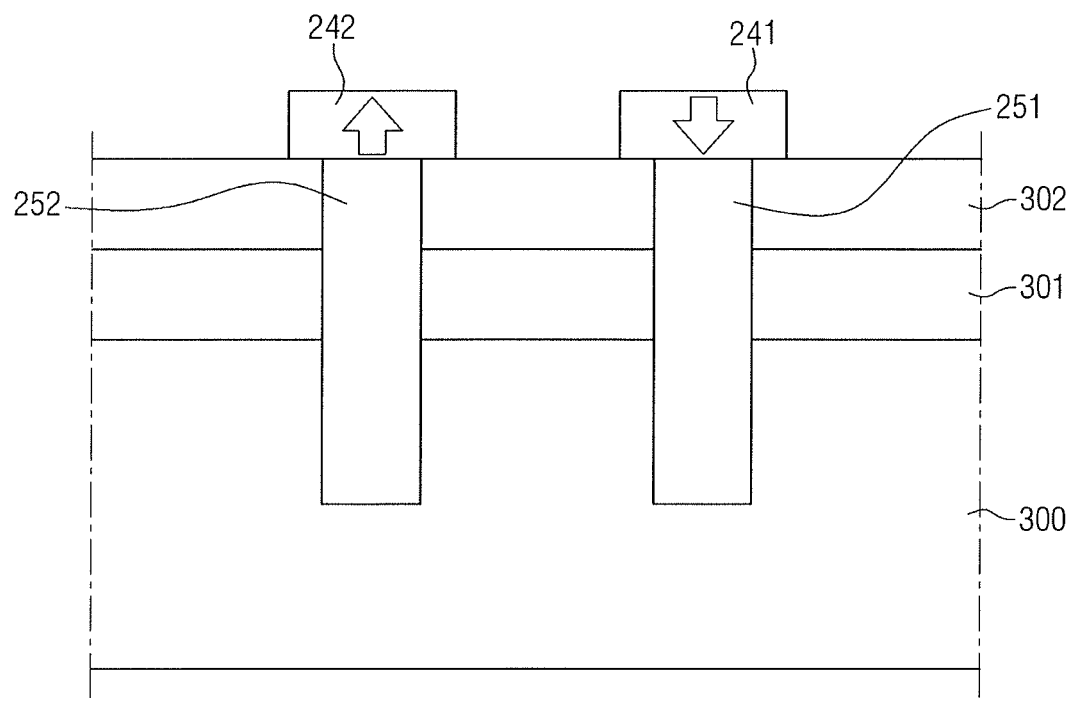

Referring to FIG. 14, a first projection portion 241 may be formed on the upper surface of the first body portion 251. For example, the first projection portion 241 may be formed on the first body portion 251 by patterning the magnetic material 332 having the first magnetic polarity direction. After the first projection portion 241 is formed, the separation layer pattern 340' may be removed. In some embodiments, at least a part of the first projection portion 241 may be formed inside the metal wiring layer 302.

Figure 15A:
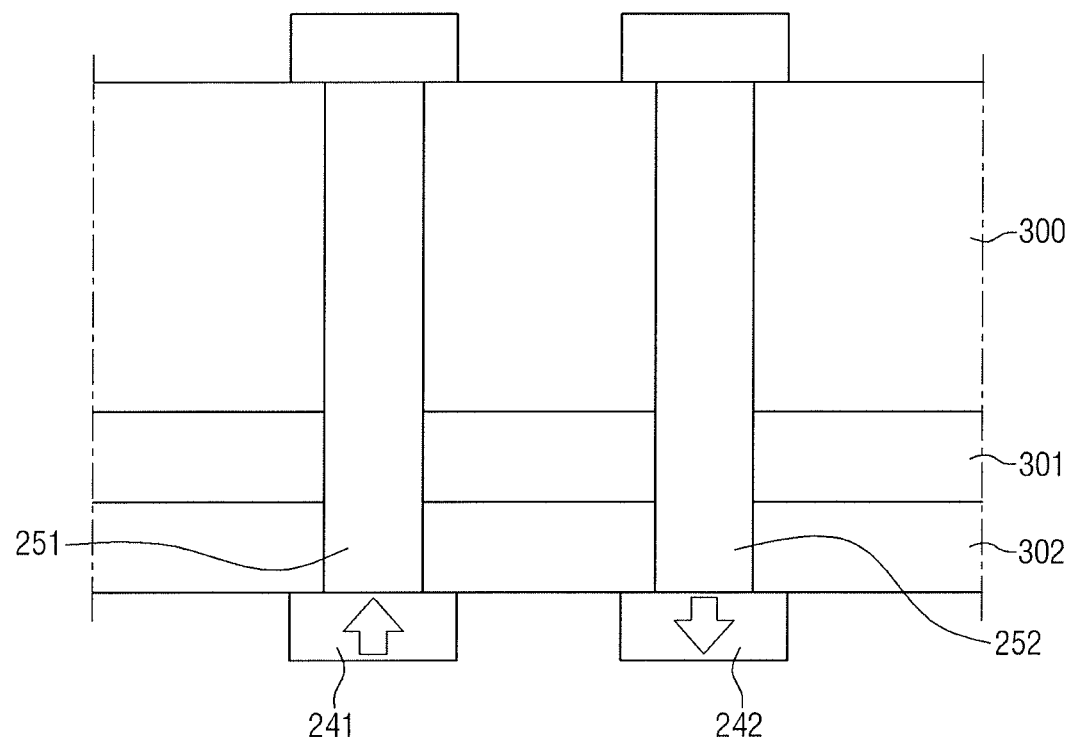

Referring to FIG. 15A, some embodiments may correspond to a semiconductor chip in the form of a flip chip. The first body portion 251 and the second body portion 252 may extend up to the upper surface of the substrate 300. In some embodiments, the first projection portion 241 and the second projection portion 242 may be entirely formed to project farther than the lower surface of the metal wiring layer 302.

Figure 15B:
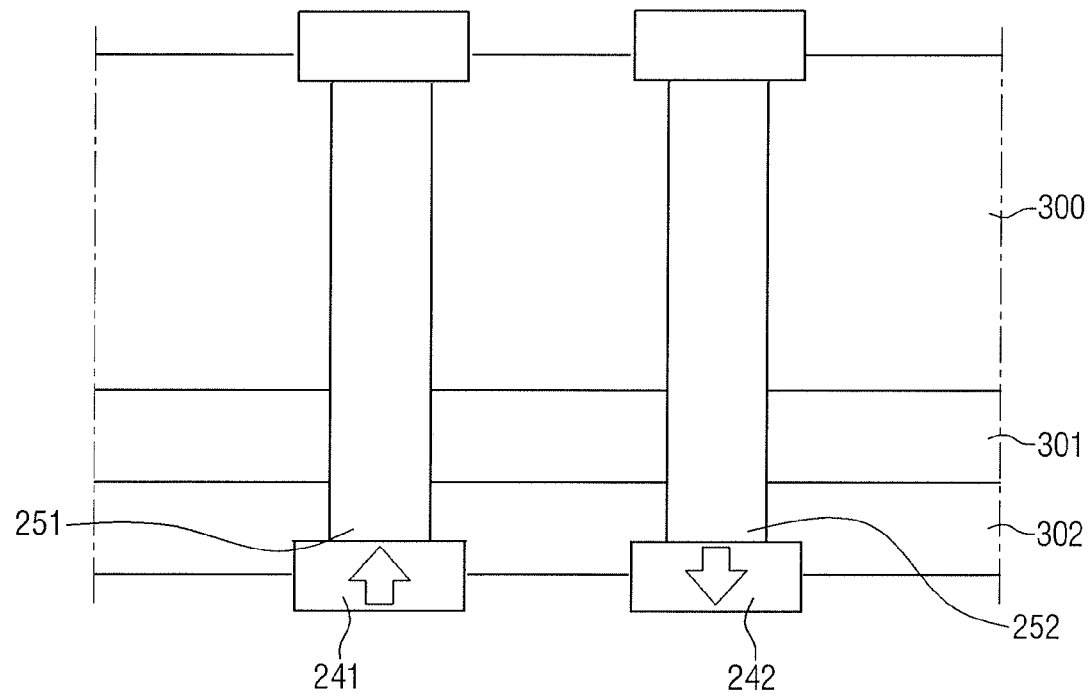

Referring to FIG. 15B, at least parts of the first projection portion 241 and the second projection portion 242 may be formed to project farther than the lower surface of the metal wiring layer 302. For example, parts of the first projection portion 241 and the second projection portion 242 may be formed in the metal wiring layer 302. In one embodiment, when forming the first trench 321 and the second trench 322 as illustrated in FIG. 9B, the first projection portion 241 and the second projection portion 242 may be formed as illustrated in FIG. 15B.

Figure 16:
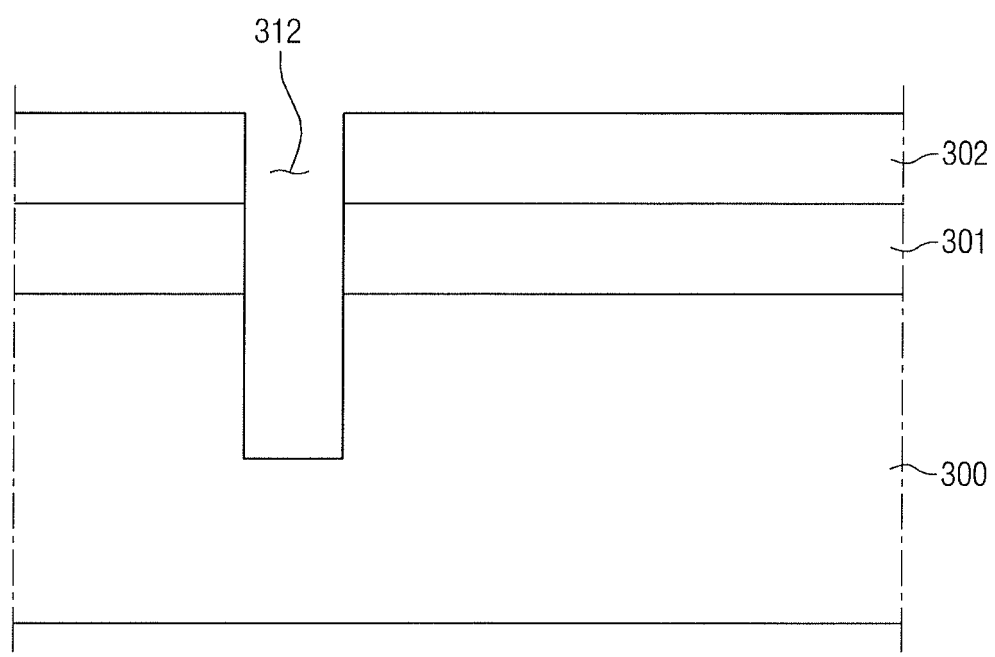

FIGS. 16 to 20 illustrate stages in another embodiment of a method for fabricating a semiconductor device. Referring to FIG. 16, a second via hole 312 may be formed to penetrate an interlayer insulating layer 301 and a metal wiring layer 302. The second via hole 312 may extend into a substrate 300.

Figure 17:
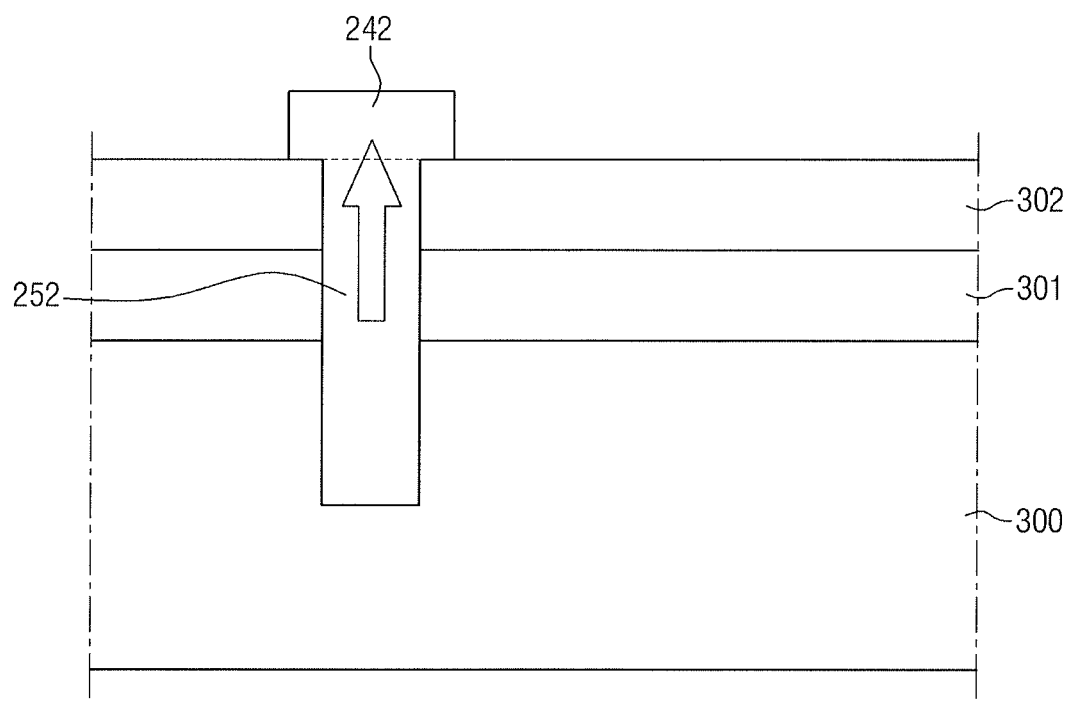

Referring to FIG. 17, a second body portion 252 and a second projection portion 242 may be formed. For example, a magnetic material 331 having a second magnetic polarity direction may be deposited on an upper surface of the metal wiring layer 302 to fill the second via hole 312. The second projection portion 242 may be formed on the second body portion 252 by patterning the deposited magnetic material 331 having the second magnetic polarity direction.

Figure 18:
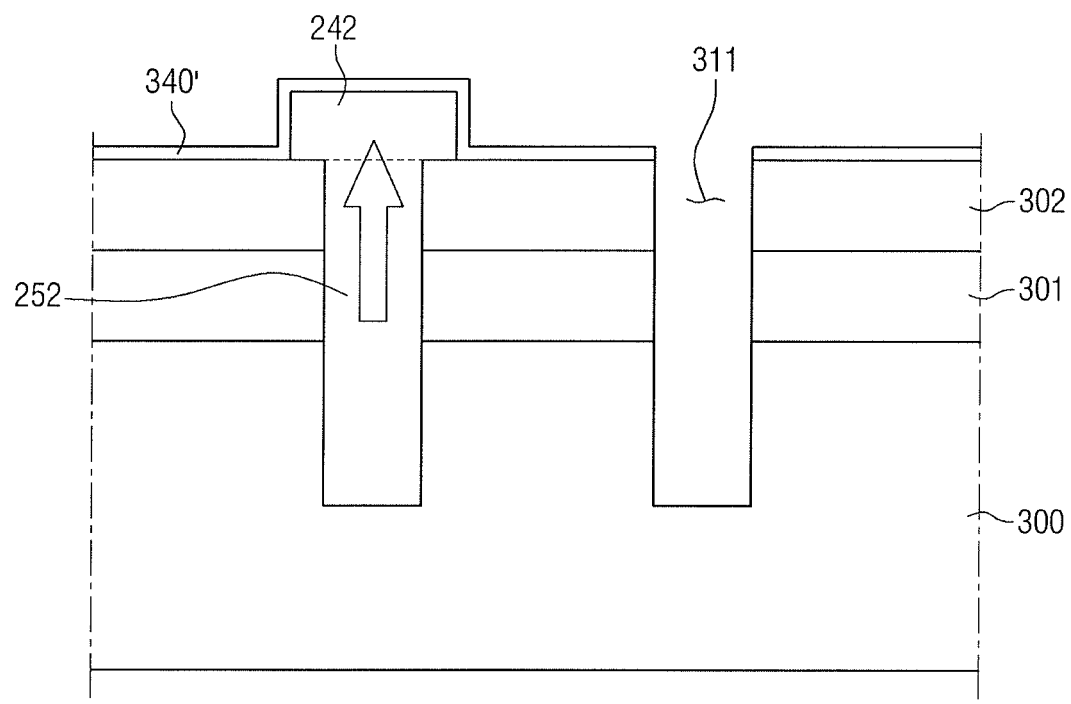

Referring to FIG. 18, a first via hole 311 may be formed to penetrate the interlayer insulating layer 301 and the metal wiring layer 302. The first via hole 311 may extend into the substrate 300. For example, a separation layer 340 is formed on an upper surface of the second projection portion 242 and an upper surface of the metal wiring layer 302. A separation layer pattern 340' may be formed through selective etching of a portion in which the first via hole 311 is to be formed. The first via hole 311 may be formed in the metal wiring layer 302 and the interlayer insulating layer 301 using the separation layer pattern 340' as a mask.

Figure 19:
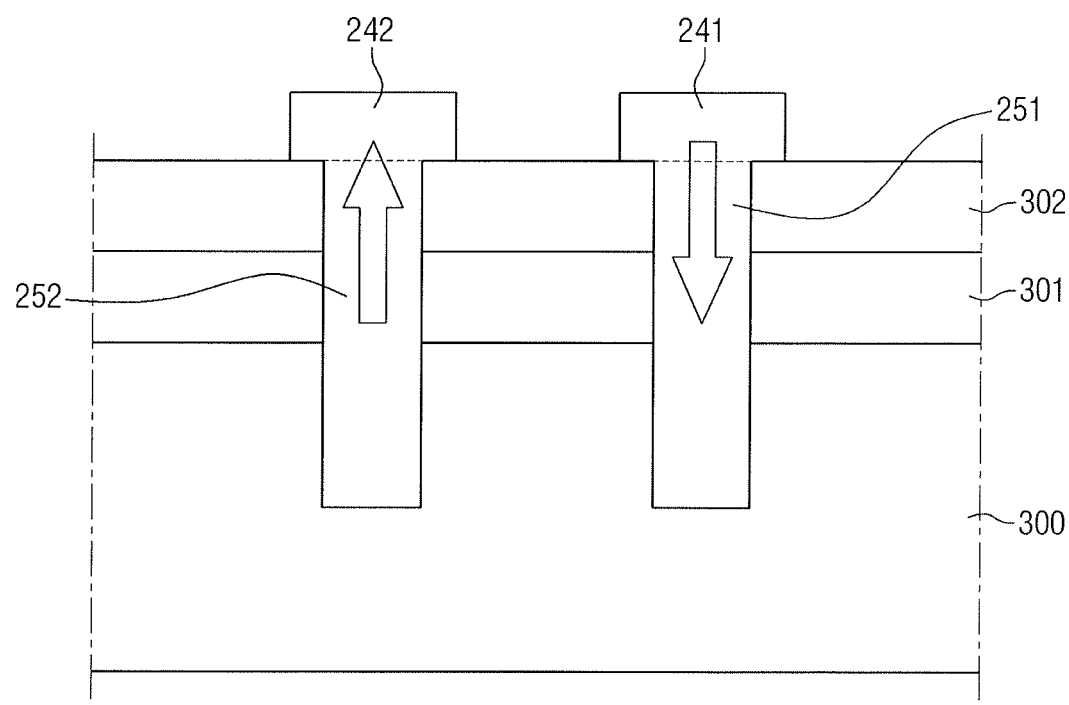

Referring to FIG. 19, a first body portion 251 and a first projection portion 241 may be formed. For example, a magnetic material 332 having a first magnetic polarity direction may be deposited on the upper surface of the metal wiring layer 302 to fill the first via hole 311. The deposited magnetic material 332 having the first magnetic polarity direction may be patterned to remain only on the first body portion 251. That is, the first projection portion 241 may be formed. After the first projection portion 241 is formed, the separation layer pattern 340' may be removed.

Figure 20:
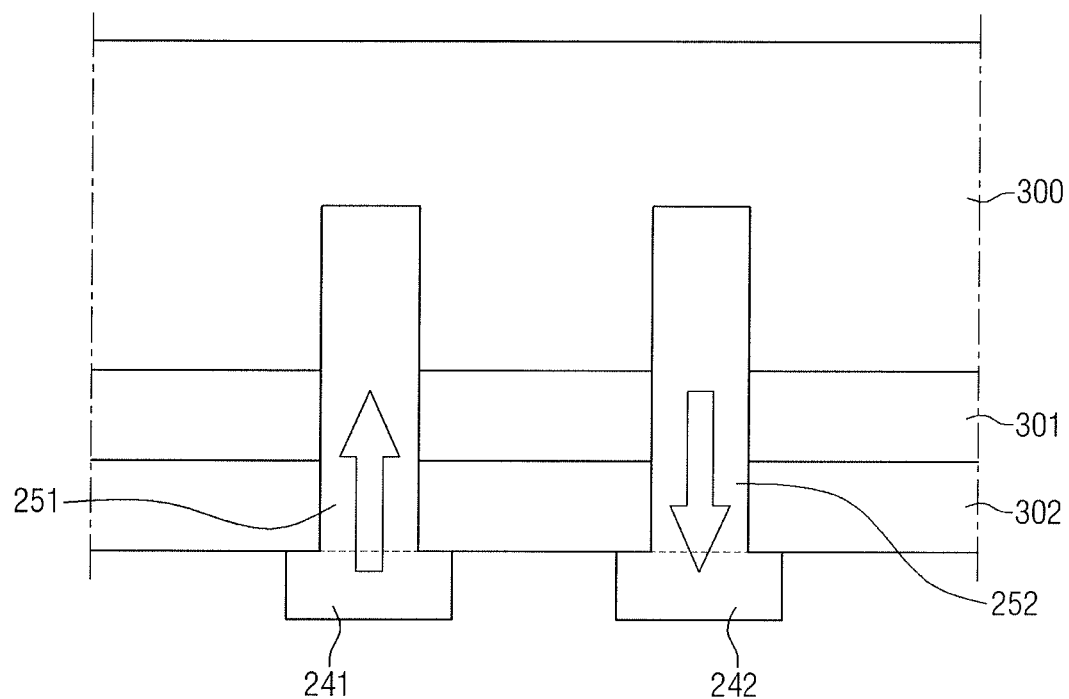

Referring to FIG. 20, in a semiconductor device according to some embodiments, the semiconductor chip may be in the form of a flip chip. The first body portion 251 and the second body portion 252 may extend up to the upper surface of the substrate 300.

Figure 21:
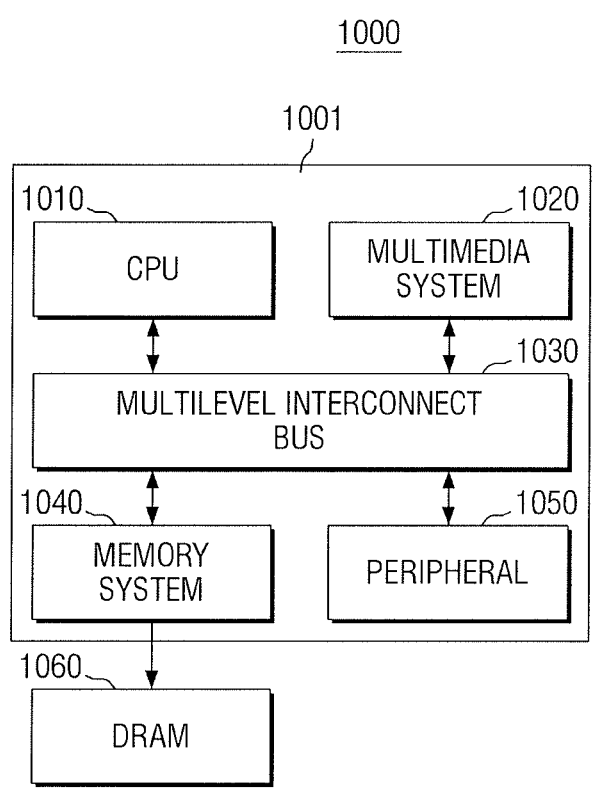
FIG. 21 illustrates an embodiment of an SoC system.

FIG. 21 illustrates an embodiment of a system-on-chip (SoC) system including a semiconductor device fabricated using any of the aforementioned method embodiments. Referring to FIG. 21, an SoC system 1000 includes an application processor 1001 and a DRAM 1060.

The application processor 1001 may include, for example, a central processing unit 1010, a multimedia system 1020, a bus 1030, a memory system 1040, and a peripheral circuit 1050. The central processing unit 1010 may perform operations required to drive the SoC system 1000. In some embodiments, the central processing unit 1010 may have a multi-core structure including a plurality of cores.

The multimedia system 1020 may be used, for example, when the SoC system 1000 performs various kinds of multimedia functions. The multimedia system 1020 may include a 3D engine module, a video codec, a display system, a camera system, and a post-processor.

The bus 1030 may be used when the central processing unit 1010, the multimedia system 1020, the memory system 1040, and the peripheral circuit 1050 perform data communication with each other. Examples of the bus 1030 may include a multilayer AHB (Advanced High-performance Bus) and a multilayer AXI (Advanced eXtensible Interface).

The memory system 1040 may provide an environment for when the application processor 1001 is connected to an external memory (e.g., DRAM 1060) to perform high-speed operation. In some embodiments, the memory system 1040 may include a separate controller (e.g., DRAM controller) for controlling the external memory (e.g., DRAM 1060).

The peripheral circuit 1050 may provide an environment for when the SoC system 1000 is smoothly connected to an external device (e.g., main board). Accordingly, the peripheral circuit 1050 may be provided with various interfaces for making the external device connected to the SoC system 1000 compatible.

The DRAM 1060 may function as an operating memory for when the application processor 1001 operates. In some embodiments, the DRAM 1060 may be arranged on an outside of the application processor 1001. Specifically, the DRAM 1060 and the application processor 1001 may be packaged in the form of PoP (Package on Package). At least one of the constituent elements of the SoC system 1000 may adopt any one of the aforementioned embodiments of the semiconductor devices.

In the aforementioned embodiments, the electrodes have been described as through-electrodes. However, the electrodes may be a different type of electrodes in another embodiment.

In accordance with one embodiment, a semiconductor device includes a first bump; a second bump; a first chip including a first electrode coupled to the first bump; and a second chip including a second electrode coupled to the second bump, wherein the first bump is connected to the second bump and wherein the first bump has different magnetic polarity directions than the second bump. The first electrode may be aligned with the second electrode based on a magnetic force between the first and second bumps. The first and second electrodes may be through-electrodes. The device may include a third bump; a fourth bump; a third electrode of the first chip coupled to the third bump; and a fourth electrode of the second chip coupled to the fourth bump, wherein the third bump is connected to the fourth bump and wherein the third bump has different magnetic polarity directions than the fourth bump. The third bump may be adjacent to the first bump, the fourth bump may be adjacent to the second bump, the first bump may have different magnetic polarity directions than the third bump, and the second bump may have different magnetic polarity directions than the fourth bump.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. For example, the embodiments may be combined to form additional embodiments. It will be understood by those of skill in the art that various changes in form and details may be made without departing from the spirit and scope of the embodiments set forth in the claims.

What is claimed is:

1. A semiconductor device, comprising:
a first semiconductor chip including a first surface and a second surface;
a second semiconductor chip including a third surface and a fourth surface, the third surface facing the second surface;
a first through-electrode and a second through-electrode between the first surface and the second surface;
a third through-electrode between the third surface and the fourth surface and connected to the first through-electrode; and
a fourth through-electrode between the third surface and the fourth surface and connected to the second through-electrode, wherein an end of the first through-electrode has a first magnetic polarity on the second surface, and an end of the second through-electrode has a second magnetic polarity opposite to the first magnetic polarity on the second surface.

2. The semiconductor device as claimed in claim 1, wherein:
an end of the third through-electrode has the second magnetic polarity on the third surface, and an end of the fourth through-electrode has the first magnetic polarity on the third surface.

3. The semiconductor device as claimed in claim 1, wherein:
the first through-electrode includes a first body portion inside the first semiconductor chip and a first projection portion connected to the first body portion, at least part of the first projection portion projecting farther than the second surface, and
the second through-electrode includes a second body portion inside the first semiconductor chip and a second projection portion connected to the second body portion, at least a part of the second projection portion projecting farther than the second surface.

4. The semiconductor device as claimed in claim 3, wherein:
the first projection portion and the second projection portion entirely project farther than the second surface,
an end of the first projection portion is the end of the first through-electrode, and
an end of the second projection portion is the end of the second through-electrode.

5. The semiconductor device as claimed in claim 3, wherein:
an end of the first projection portion is the end of the first through-electrode, and
an end of the second projection portion is the end of the second through-electrode.

6. The semiconductor device as claimed in claim 3, wherein:
each of the first body portion and the second body portion includes a non-magnetic material, and
each of the first projection portion and the second projection portion includes a magnetic material.

7. The semiconductor device as claimed in claim 3, wherein:
the first body portion includes a same magnetic material as the magnetic material of the first projection portion, and
the second body portion includes a same magnetic material as the magnetic material of the second projection portion.

8. The semiconductor device as claimed in claim 3, wherein:
the first body portion includes a first magnetic material, and
the first projection portion includes a second magnetic material different from the first magnetic material.

9. The semiconductor device as claimed in claim 1, wherein:
the first semiconductor chip includes a fifth through-electrode between the first surface and the second surface,
an end of the fifth through-electrode has a non-magnetic polarity on the second surface.

10. The semiconductor device as claimed in claim 1, further comprising:
a package substrate on which the first semiconductor chip and the second semiconductor chip are arranged to overlap each other, wherein the first semiconductor chip and the second semiconductor chip are successively stacked on the package substrate.

11. A semiconductor device, comprising:
a first semiconductor chip including a first surface and a second surface;

a second semiconductor chip including a third surface and a fourth surface, the third surface facing the second surface;

a first bump on the second surface and projecting farther than the second surface;

a second bump on the second surface and projecting farther than the second surface;

a third bump on the third surface to project farther than the third surface and connected to the first bump; and a fourth bump on the third surface to project farther than the third surface and connected to the second bump, wherein a direction of a magnetic field in the first bump is different from a direction of a magnetic field in the second bump.

12. The semiconductor device as claimed in claim 11, further comprising:

a first through-via extending between the first surface and the second surface in the first semiconductor chip and connected to the first bump; and a second through-via extending between the first surface and the second surface in the first semiconductor chip and connected to the second bump, wherein the first through-via and the second through-via include a non-magnetic material.

13. The semiconductor device as claimed in claim 11, wherein:

a direction of a magnetic field in the third bump is equal to the direction of the magnetic field in the first bump, and a direction of a magnetic field in the fourth bump is equal to the direction of the magnetic field in the second bump.

14. The semiconductor device as claimed in claim 11, further comprising:

a fifth bump on the second surface to project farther than the second surface, wherein the fifth bump includes a non-magnetic material.

15. The semiconductor device as claimed in claim 14, further comprising:

a third through-via between the first surface and the second surface in the first semiconductor chip, wherein the third through-via includes a non-magnetic material.

16. A semiconductor device, comprising:

a first bump;

a second bump;

a first chip including a first electrode coupled to the first bump; and a second chip including a second electrode coupled to the second bump, wherein the first bump is connected to the second bump and wherein the first bump has different magnetic polarity directions than the second bump.

17. The semiconductor device as claimed in claim 16, wherein the first electrode is aligned with the second electrode based on a magnetic force between the first and second bumps.

18. The semiconductor device as claimed in claim 16, wherein the first and second electrodes are through-electrodes.

19. The semiconductor device as claimed in claim 16, further comprising:

a third bump;

a fourth bump;

a third electrode of the first chip coupled to the third bump; and a fourth electrode of the second chip coupled to the fourth bump, wherein the third bump is connected to the fourth bump and wherein the third bump has different magnetic polarity directions than the fourth bump.

20. The semiconductor device as claimed in claim 19, wherein:

the third bump is adjacent to the first bump, the fourth bump is adjacent to the second bump, the first bump has different magnetic polarity directions than the third bump, and the second bump has different magnetic polarity directions than the fourth bump.

* * * * *